United States Patent [19]

Lee

[11] Patent Number: 6,089,635

[45] Date of Patent: Jul. 18, 2000

[54] MODULAR IC HOLDING DEVICE IN MODULAR IC HANDLER

[75] Inventor: Sang Soo Lee, Chungcheongnam-do, Rep. of Korea

[73] Assignee: Mirae Corporation, Kyungki-do, Rep. of Korea

[21] Appl. No.: 09/104,636

[22] Filed: Jun. 25, 1998

[30] Foreign Application Priority Data

Dec. 27, 1997 [KR]  Rep. of Korea ...................... 97/75448

[51] Int. Cl.$^7$ .................................................. B25J 15/02
[52] U.S. Cl. ........................ 294/88; 294/119.1; 294/907
[58] Field of Search .................. 294/88, 103.1, 294/119.1, 902, 907; 29/739, 741; 269/25, 32; 279/110, 123; 414/730, 741; 901/32, 37, 39, 47

[56] References Cited

U.S. PATENT DOCUMENTS

| | | | |
|---|---|---|---|
| 4,423,998 | 1/1984 | Inaba et al. ...................... 294/119.1 X |
| 4,591,198 | 5/1986 | Monforte ............................ 294/907 X |
| 4,611,846 | 9/1986 | Feiber et al. ..................... 294/119.1 X |
| 4,723,806 | 2/1988 | Yuda ..................................... 294/119.1 |
| 4,861,087 | 8/1989 | Park ..................................... 294/119.1 |
| 4,866,824 | 9/1989 | Falk et al. ........................ 294/119.1 X |
| 5,520,501 | 5/1996 | Kouno et al. .................... 294/119.1 X |
| 5,620,223 | 4/1997 | Mills ................................. 294/119.1 X |

FOREIGN PATENT DOCUMENTS

| | | | |
|---|---|---|---|
| 235219 | 4/1986 | Germany ............................. 294/119.1 |
| 663887 | 3/1994 | Japan ................................... 294/119.1 |
| 1024271 | 6/1983 | U.S.S.R. ............................. 294/119.1 |

*Primary Examiner*—Johnny D. Cherry
*Attorney, Agent, or Firm*—Sheridan Ross P.C.

[57] ABSTRACT

Modular IC holding device in a modular IC handler, is disclosed, for holding a modular IC when loading or unloading the modular IC, including a lifting block having both ends and a central isolation wall and adapted to move for a certain stroke in up and down directions, a guide bar coupled to the lifting block in a horizontal direction, one pair of horizontal movement cylinders each in one of the ends of the lifting block unitary therewith, one pair of sliders coupled to the guide bar for horizontal movement in opposite directions to each other according to operation of the cylinders, one pair of fingers respectively coupled to the one pair of sliders, and a sensor provided to the lifting block for sensing presence of the modular IC.

6 Claims, 8 Drawing Sheets

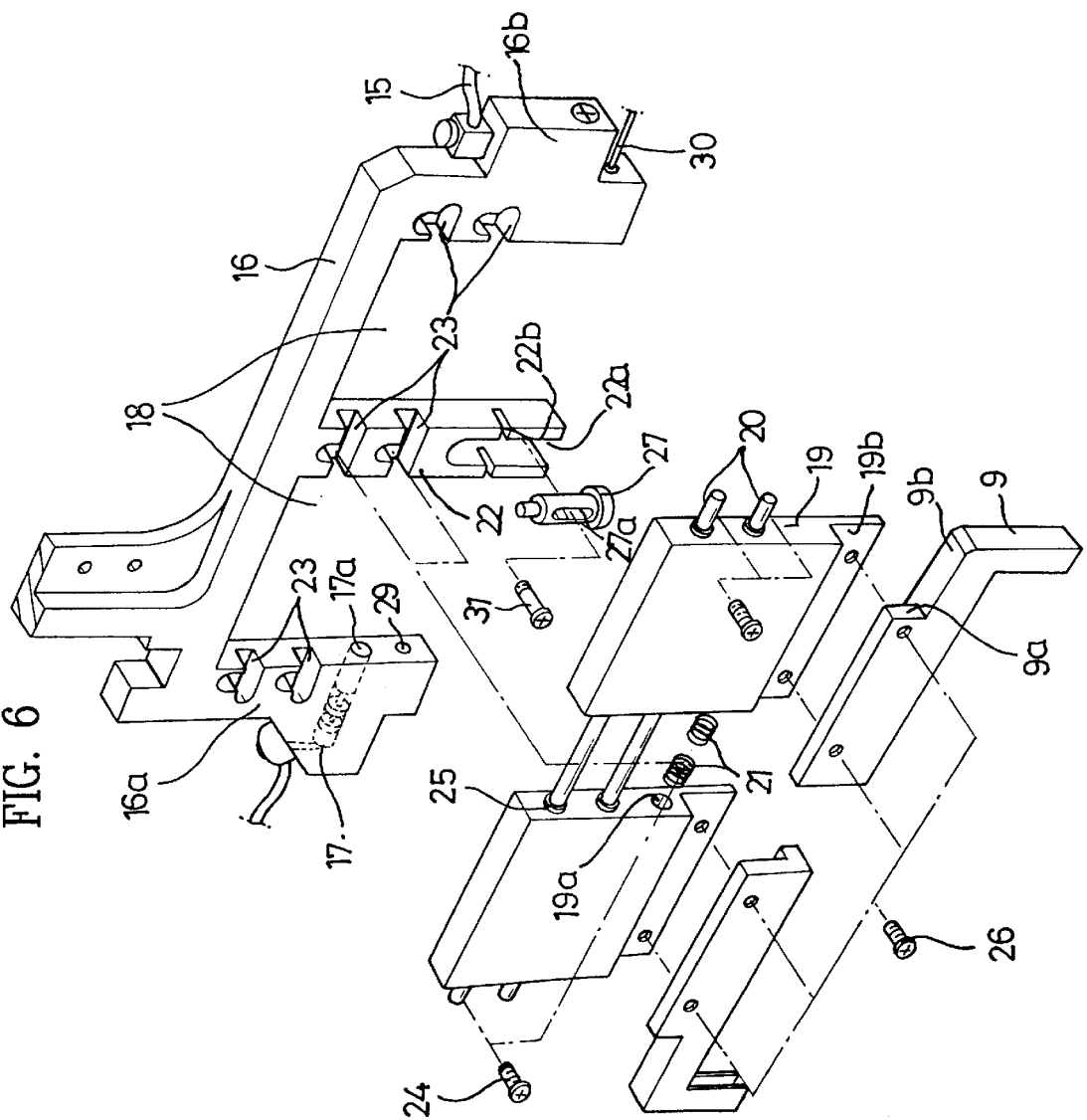

MODULAR IC HOLDING DEVICE IN MODULAR IC HANDLER

BACKGROUND OF THE INVENTION

1. Field of the Invention

The present invention relates to a modular IC handler for inspecting the performance of a modular IC, and more particularly, to a modular IC holding device in a modular IC handler for holding a modular IC when loading the modular IC from a cassette to a test socket or unloading the modular IC, of which a test has been completed, from the test socket to an empty cassette.

2. Discussion of the Related Art

In general, the modular IC is provided with a plurality of ICs and components soldered on one face or both faces of a circuit board to form an independent circuit, which is mounted on a main circuit board for extension of a capacity or a function. Since such modular IC has a value added thereto higher than individual ICs, IC manufacturers develop and sell modular ICs as a main product. Because the reliability of the modular IC product is very important, the modular IC products pass through a strict quality control process, to forward only products that have good quality, and to correct or discard products that are determined to be defective. There has been no device which automatically loads a completed modular IC on the socket, conducts a test, automatically classifies the modular IC according to a result of the test, and unloads the modular IC into the cassette. Therefore, a worker should pick-up the modular IC from the cassette one by one manually, load it into the socket, conduct a test, classify it according to a result of the test, and unload it into an unloading cassette. Thus, the modular IC testing work has a low working efficiency, that results in a low productivity. Eventually, the applicant has developed a handler which picks up a completed modular IC in a cassette by means of a picking up means, automatically loads it into a socket, conducts a test, automatically classifies and unloads it into an empty cassette according to a result of the test (Korea patent laid open Nos. 97-072236 and 97-072275, and Korea utility model laid open No. 97-059865).

FIG. 1 illustrates a front view of a loading part in a modular IC handler shown in Korea patent laid open No. 97-072275 of the applicant, and FIG. 2 illustrates a side view of the loading part shown in FIG. 1, provided with a carrier 2 coupled to a robot shaft 1 for moving in up and down directions, a lifting piece 3 coupled to the carrier 2 for moving in up and down directions, and at least one modular IC pick-up means under the lifting piece on both sides thereof for moving in up and down directions in picking up a modular IC 4 in a cassette or a socket (not shown).

The modular IC pick-up means will be explained. There is at least one lifting block 5 movable in up and down directions under the lifting piece 3. There is a first cylinder 6 for moving the lifting block 5 between the lifting piece 3 and the lifting block 5 such that the lifting block 5 moves for a preset stroke in up and down directions according to the operation of the first cylinder 6. The aforementioned lifting block 5 is provided with a holder for holding a modular IC in a socket or a cassette.

A background art holder will be explained with reference to FIGS. 3 and 4.

There are second cylinders 7 fixed to both ends of the lifting block 5, and a cylinder for moving in a horizontal direction. There is a slider 8 fixed to a rod 7a of each of the second cylinders movable according to a movement of the second cylinder, and there is a finger 9 fixed to each of the sliders in opposite direction for holding both sides of a board of the modular IC. And, one of the fingers 9 has a contact sensor 10 for determining holding of a modular IC in driving the second cylinder 7. FIGS. 4 and 5 illustrate the second cylinder 7 for moving the finger 9 in more detail. The slider 8 is provided with V-grooves 8a in both sides thereof for stable movement of the slider 8 fixed to the rod 7a, and the second cylinder 7 is also provided with V-grooves 7b opposite to the V-grooves 8a in the slider 8. Roller bearings 11 are inserted between the opposite V-grooves for minimizing a contact friction in movement of the slider 8. The second cylinder 7 is formed divided in two parts, body 12 and cover 13, for assembly of the slider 8 with screws 14.

The operation of the background art holder will be explained.

The lifting block 5 moving in up and down directions according to the operation of the first cylinder 6 is located at a top dead point when the holder is not at hold of a modular IC, and the fingers 9 which move oppositely in a horizontal direction according to operation of the second cylinder 7 are wide open to opposite sides greater than a modular IC, i.e., a width of the board. And, as shown in FIG. 2, in the case of the handler with a plurality of lifting blocks 5 for handling a plurality of modular ICs 4, the lifting blocks 5 on the right are spaced at short intervals for holding modular ICs before test in cassettes spaced at short intervals and the lifting blocks 5 on the left are spaced at wide intervals for holding modular ICs in test sockets spaced at wide intervals. When the first cylinders 6 are operated to lower the lifting block 5 for holding a modular IC, the fingers 9 are positioned on both sides of the modular IC, with the fingers 9 wide open. Upon operation of the second cylinders 7 on the lifting block 5 by means of compressed air supplied through the compressed air hose, the wide open fingers 9 come closer to each other to hold the modular IC from both sides. Only when the lifting block 5 is lowered by operation of the first cylinders 6 and the contact sensor 10 at one side of the finger 9 pressed by the modular IC to sense the modular IC, the second cylinders 7 on the lifting block are operated to hold the modular IC; if not, the second cylinders are not operated. When the lifting blocks 5 are lowered and the modular ICs in cassettes or sockets are held, the first cylinders 6 are operated again, to elevate the lowered lifting block 5, completing picking-up of the modular IC.

However, the background art device has the following problems.

First, an upper surface of the finger 9 is brought into close contact with an underside of the slider 8 in assembly of both. Therefore, the lack of a reference surface may cause an assembly with the finger slanted, frequently impeding holding of the modular IC at right positions.

Second, as the body 12 of the second cylinder 7 is distorted at processed portions when the body 12 is heat treated, the body 12 of the second cylinder in general has not been heat treated while the cover 13 only is heat treated. Accordingly, when the holder is used for a long time, the body 12 of the second cylinder 7, which is not heat treated, is seriously worn down as the slider moves due to friction with the roller bearings 11, causing an erratic operation of the second cylinder to drop a modular IC held by the fingers 9 in the middle of operation.

Third, since the sensor 10 sensing existence of a modular IC to hold is a contact type, there have been cases when the sensor can not sense the modular IC due to wear down from prolonged use.

Fourth, the two lengthy compressed air hoses 15 connected to each of the double-acting second cylinders 7 interfere with movements of the lifting blocks 5 and the second cylinders 7.

SUMMARY OF THE INVENTION

Accordingly, the present invention is directed a modular IC holding device in a modular IC handler that substantially obviates one or more of the problems due to limitations and disadvantages of the related art.

An object of the present invention is to provide a modular IC holding device in a modular IC handler, which can make a safe and accurate hold of a modular IC by means of fingers.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the modular IC holding device in a modular IC handler includes a lifting block having both ends and a central isolation wall and adapted to move for a certain stroke in up and down directions, a guide bar coupled to the lifting block in a horizontal direction, one pair of horizontal movement cylinders each in one of the ends of the lifting block unitary therewith, one pair of sliders coupled to the guide bar for horizontal movement in opposite directions to each other according to operation of the cylinders, one pair of fingers respectively coupled to the one pair of sliders, and sensing means provided to the lifting block for sensing presence of the modular IC.

The sensing means includes a pusher fitted in the isolation wall of the lifting block for moving in up and down directions depending on contact of the pusher with the modular IC, and a photosensor at each of the ends of the lifting block for being operative as the pusher moves up and down.

Thus, the modular IC holding device in a modular IC handler of the present invention can hold a modular IC, accurately.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 6 illustrates an exploded perspective view of a device for holding a modular IC in a modular IC handler in accordance with a preferred embodiment of the present invention;

FIGS. 7A and 7B respectively illustrate sections of the device for holding a modular IC in a modular IC handler in accordance with a preferred embodiment of the present invention, wherein, FIG. 7A illustrates a state before the fingers hold a modular IC, and FIG. 7B illustrates a state while the fingers hold a modular IC; and, FIG. 8 illustrates a section across line I—I in FIG. 7A.

DETAILED DESCRIPTION OF THE PREFERRED EMBODIMENT

Figure 1:
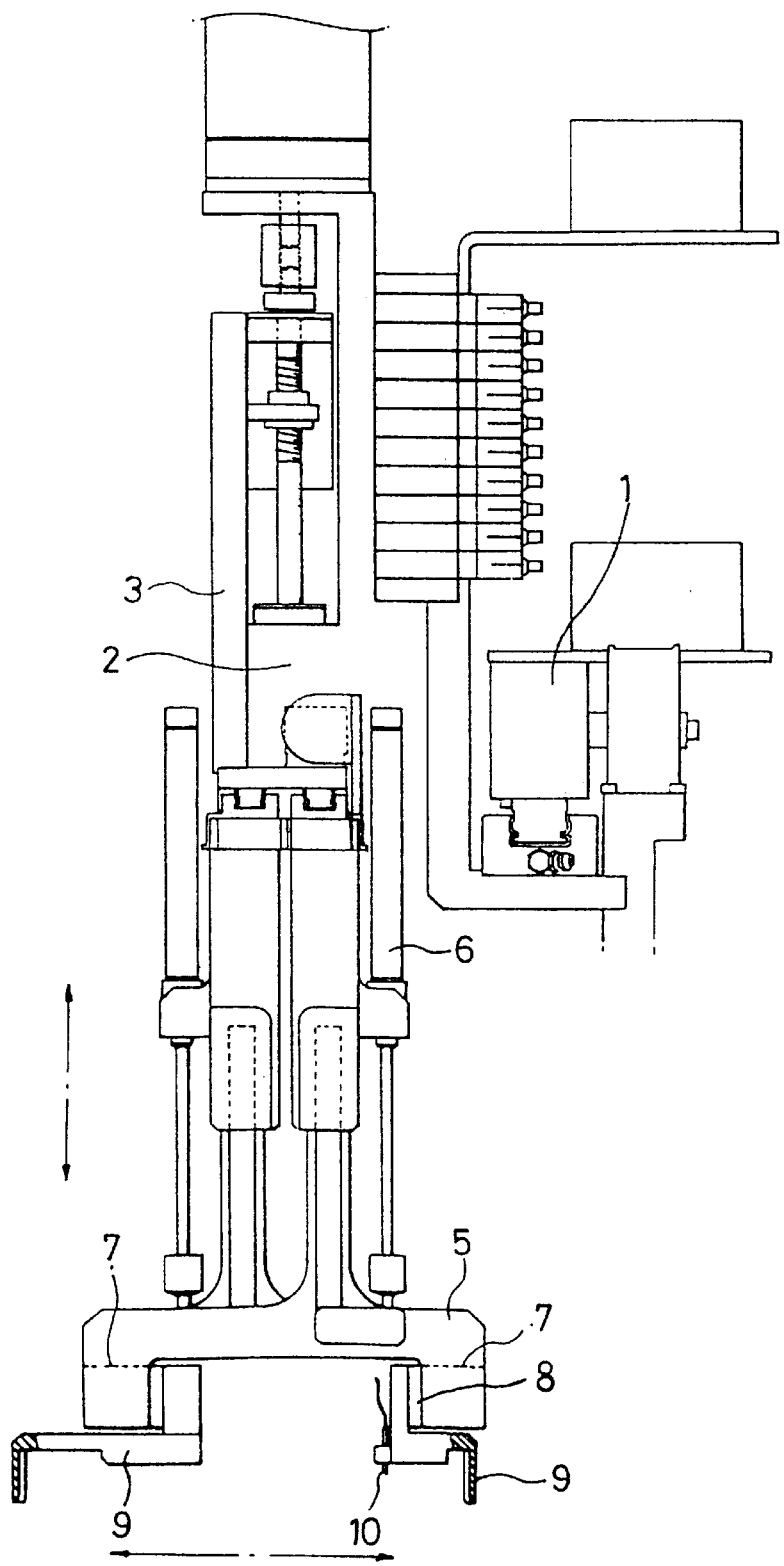
FIG. 1 illustrates a front view of a loading part in a background art modular IC handler.
Figure 2:
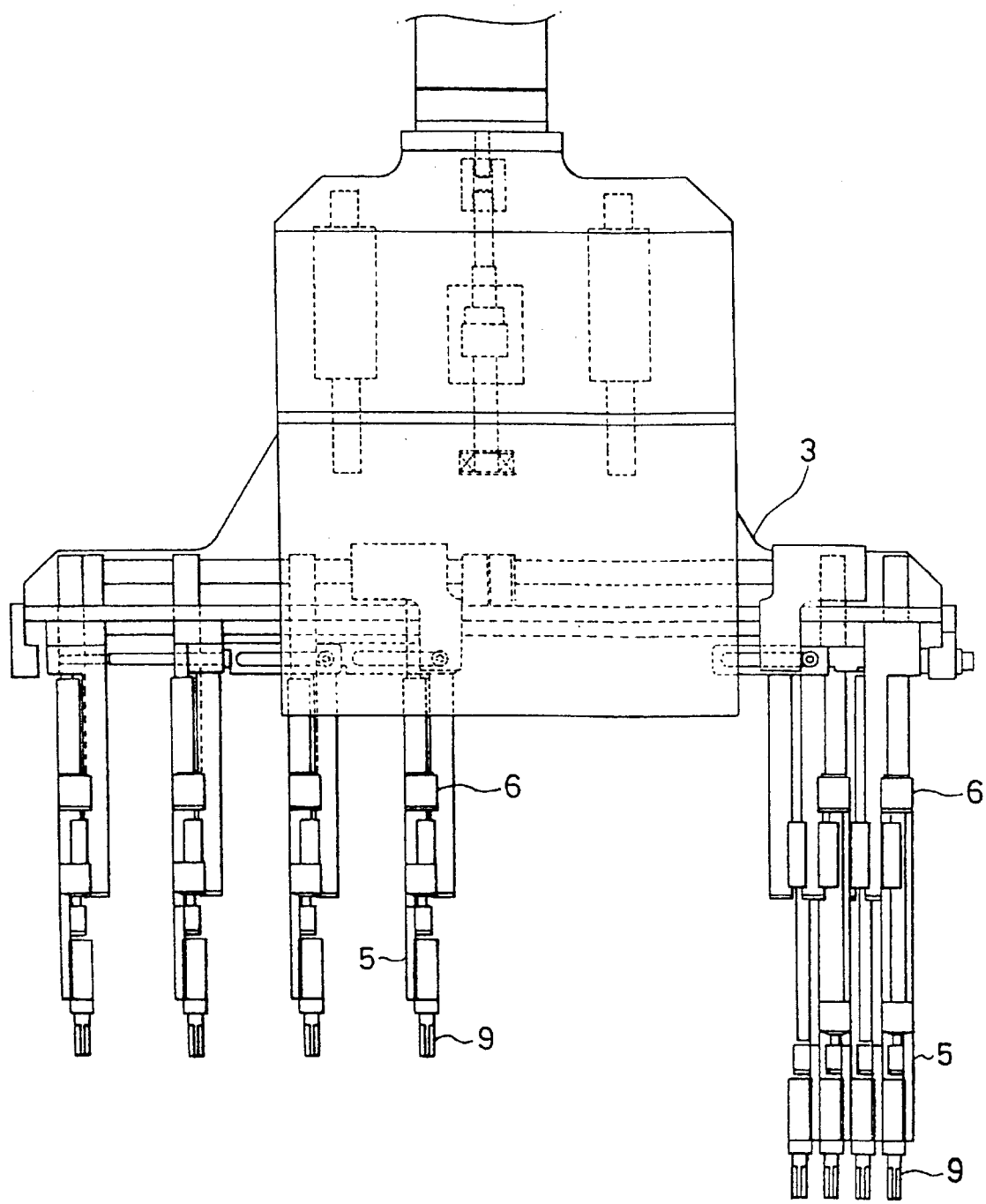
FIG. 2 illustrates a side view of the loading part shown in FIG. 1.
Figure 3:
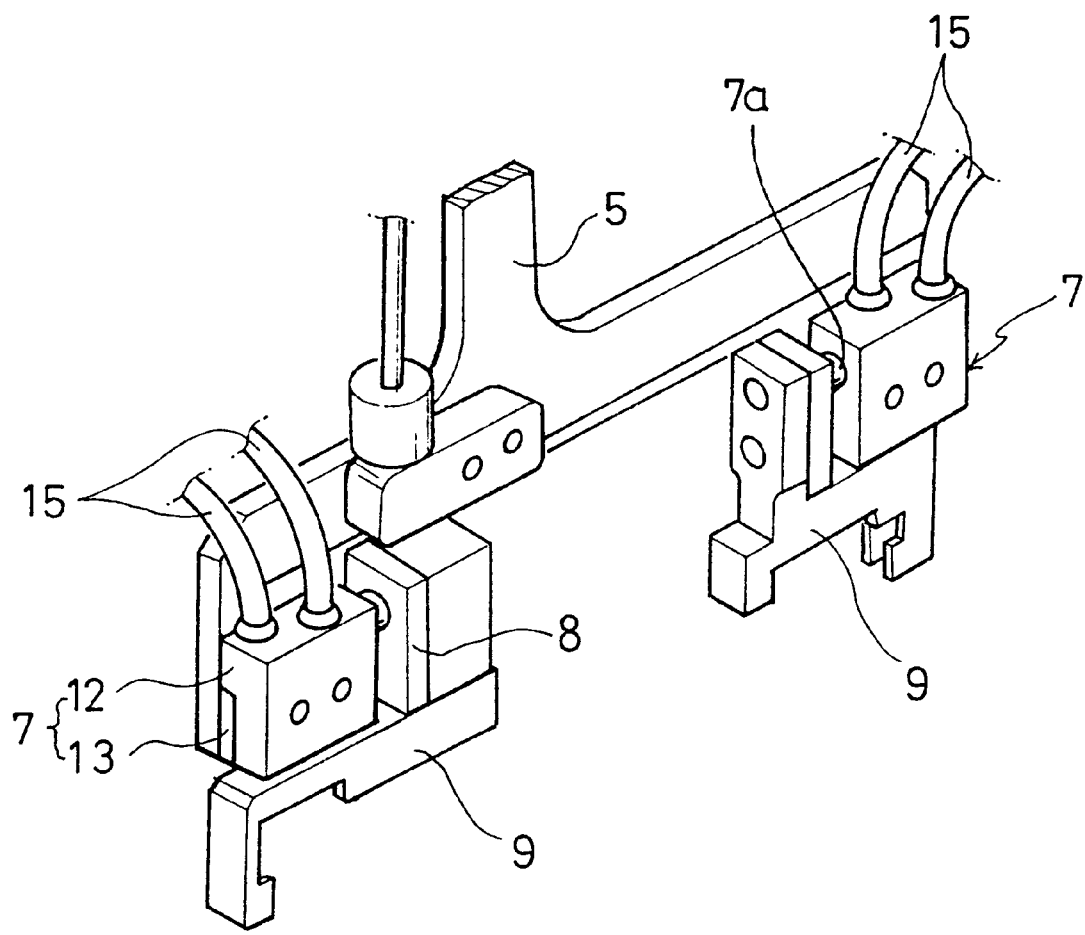
FIG. 3 illustrates a front view of a holder in the background art modular IC handler.
Figure 4:
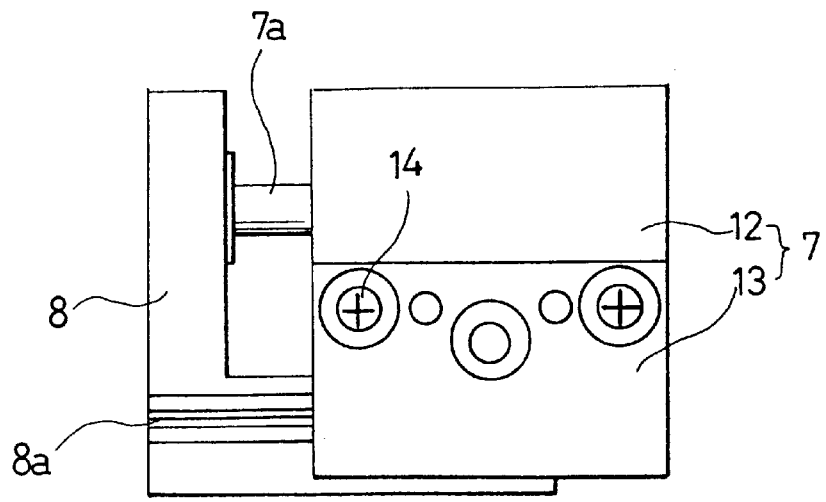
FIG. 4 illustrates a back side view showing a state of coupling of the second cylinder and the slider in the holder of the background art modular IC.
Figure 5:
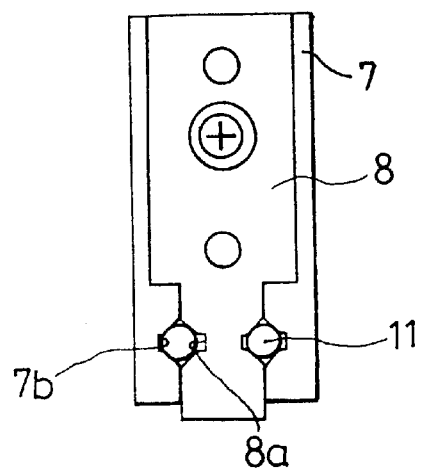
FIG. 5 illustrates a left side view of the coupling of the second cylinder and the slider shown in FIG. 4.
Figure 7A:
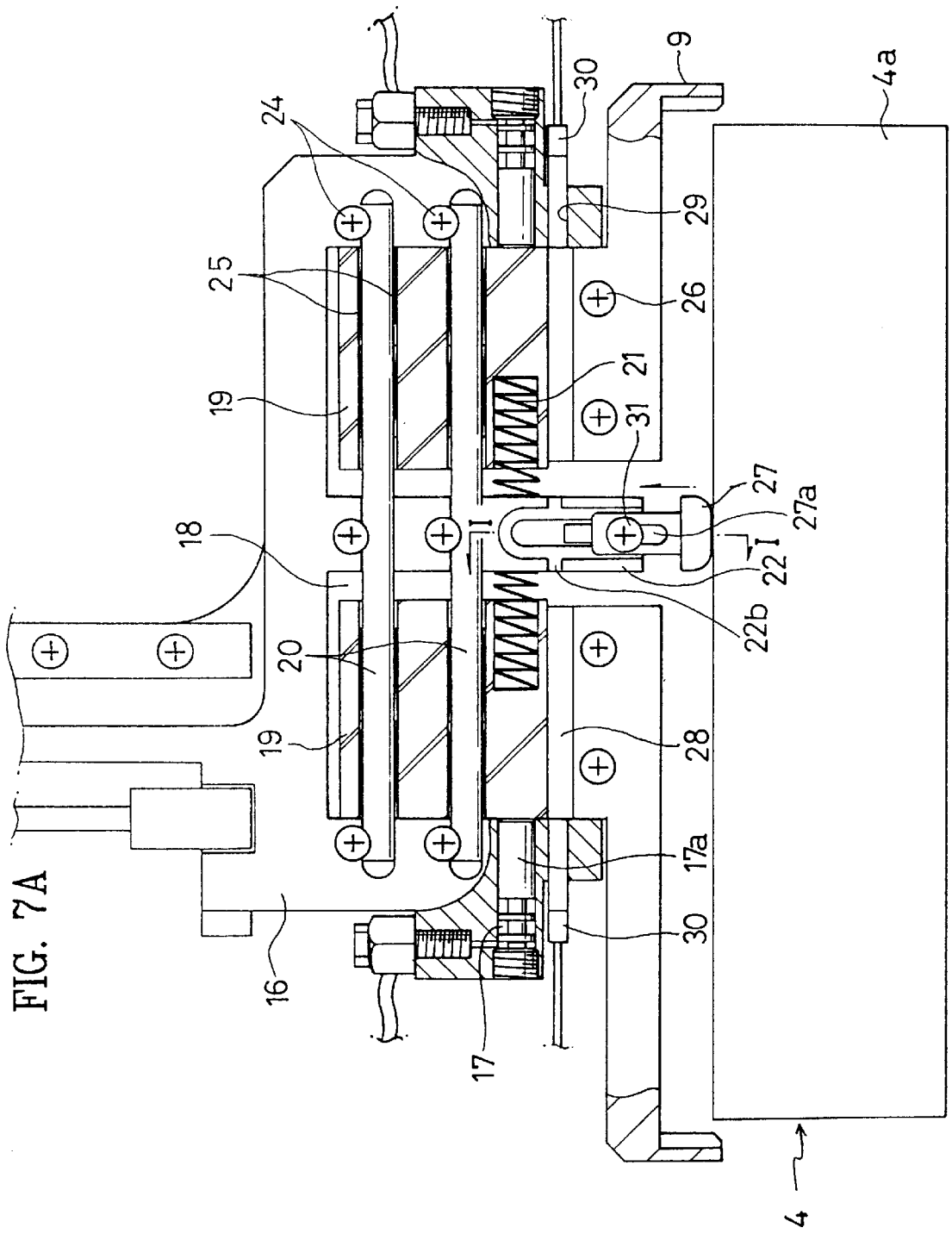
Figure 7B:
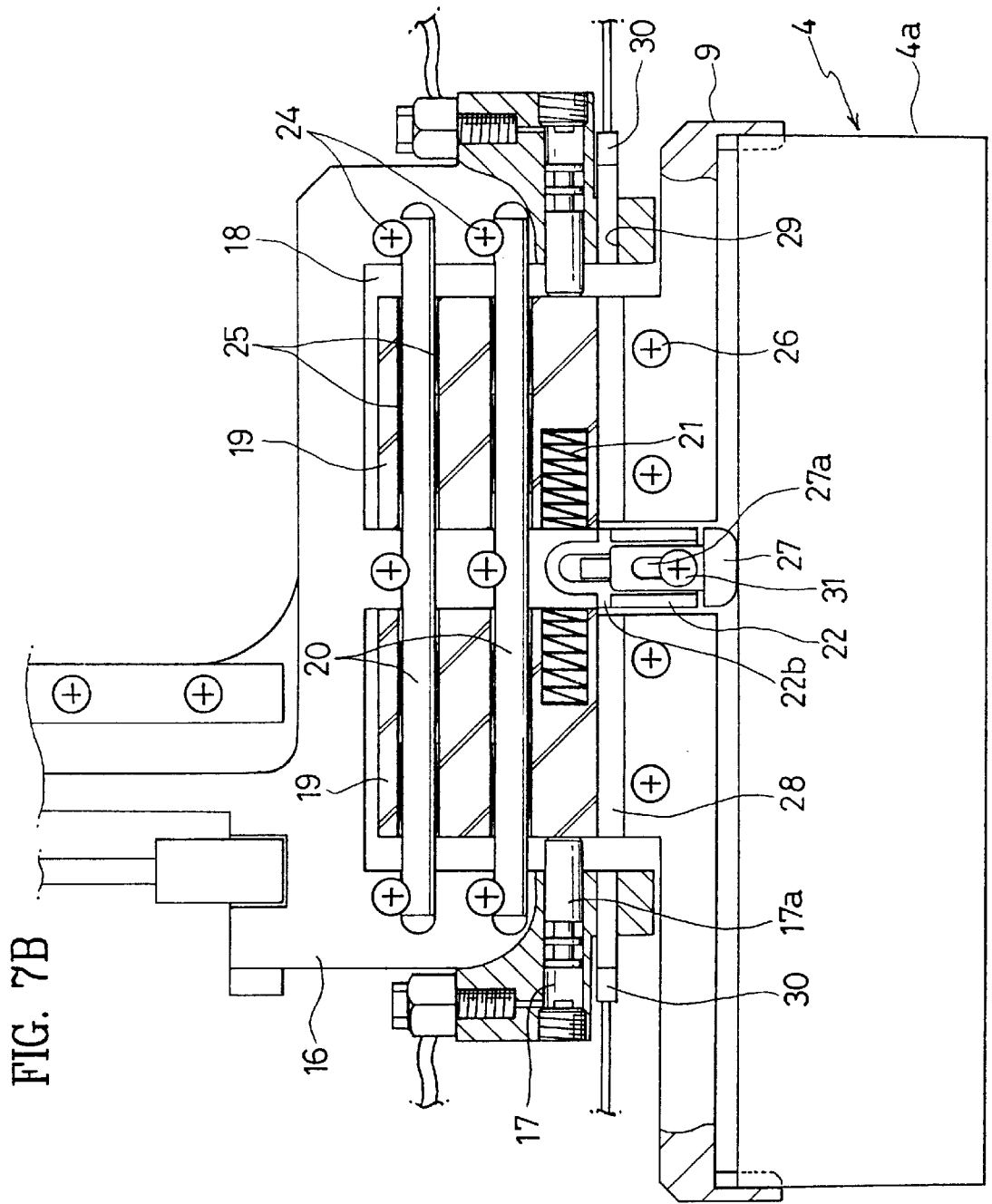
Figure 8:
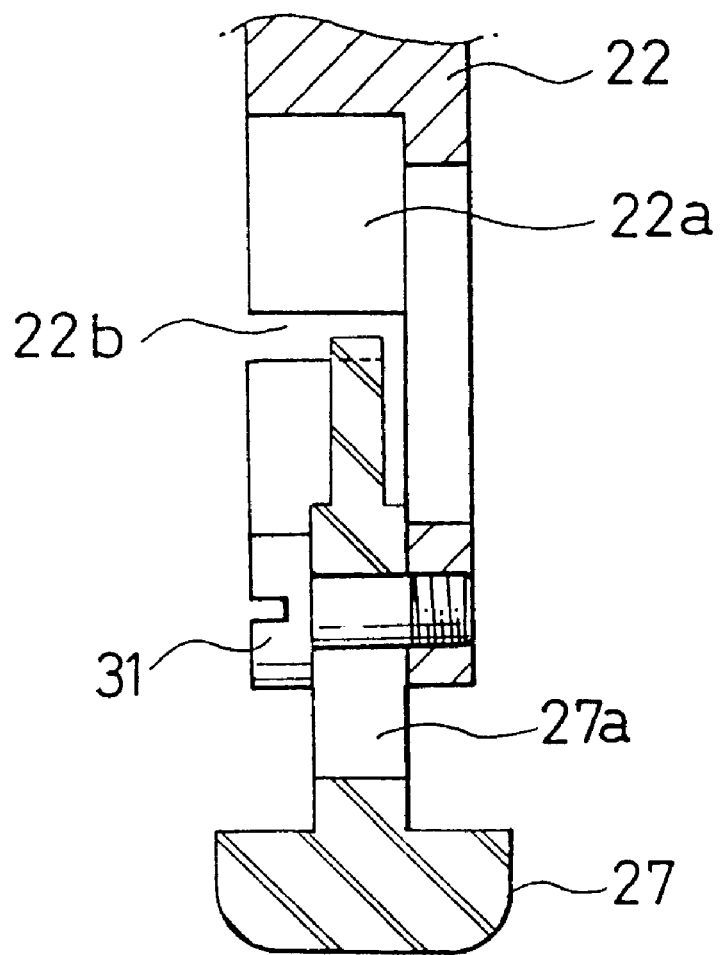

Reference will now be made in detail to the preferred embodiments of the present invention, examples of which are illustrated in the accompanying drawings. FIG. 6 illustrates an exploded perspective view of a device for holding a modular IC in a modular IC handler in accordance with a preferred embodiment of the present invention, FIGS. 7A and 7B respectively illustrate sections of the device for holding a modular IC in a modular IC handler in accordance with a preferred embodiment of the present invention, wherein FIG. 7A illustrates a state before the fingers hold a modular IC, and FIG. 7B illustrates a state while the fingers hold a modular IC, and FIG. 8 illustrates a section across line I—I in FIG. 7A. Parts identical to the background art will be given the same reference numerals, and explanations of the identical parts will be omitted.

There is a lifting block 16 provided with two ends 16a and 16b, forming spaces 18 between the ends 16a and 16b and an isolation wall 22. Each of the ends 16a and 16b of the lifting block 16 has a unitary second cylinder 17 formed therein for horizontal movements, and a slider 19, which moves interlocked with the second cylinder 17, is fitted in each of the spaces 18 in the lifting block, for moving in a horizontal direction guided by one pair of guide bars 20. The second cylinder 17 is preferably a single acting type, though it may be a double acting type, because it leads to having only one compressed air hose 15 connected to the lifting block 16, which minimizes interference from the compressed air hose 15 during operation. For employing the single acting type second cylinder 17, an elastic member 21, such as a compression spring, should be provided at one side of the slider for restoring the slider 19 when no compressed air exerts force thereon. To provide the elastic member 21 at one side of the slider 19, an inserting hole 19a is formed in the slider for inserting the elastic member 21 therein, which should be designed to make a close contact with the isolation wall 22. The guide bars 20 which guide movements of the slider 19 are inserted in fastening slots 23 in the lifting block 16 and fixed by screws 24. And, as shown in FIG. 7A, a ball bush 25 is inserted between the slider 19 and the guide bar 20 for a smooth movement of the slider 19. A finger 9 is fixed to a lower side of the slider 19, which moves as the second cylinder 17 is operated, by fastening members 26 for holding a modular IC 4. A stepped portion 19b at a lower part of one side of the slider 19 and a jointing portion 9a provided on the finger 9 for jointing to the stepped portion 19b are jointed such that a reference surface 9b on the finger 9 is brought into a close contact with a bottom surface of the slider 19, for preventing defective assembly which may cause defective holding of the modular IC 4.

In the meantime, in the present invention, sensing means is provided for controlling operation of the second cylinder 17 as the finger 9 holds the modular IC 4. The sensing means will be explained with reference to FIGS. 6 and 8.

The isolation wall 22 in the lifting block 16 has a recess 22a for fitting a pusher 27 therein to be movable in up and down directions, and both ends of the lifting block are fitted with photosensors 30. And, slits 22b, sensor holes 29 and gaps 28 are provided at a same height, i.e, at a height corresponding to a top portion of the pusher 27 when the pusher 27 is positioned at a bottom dead point, for allowing the passage of light emitted from the photosensors 30. In detail, the isolation wall 22 in the lifting block has the slits 22b formed therein, the both ends 16a and 16b have sensor holes 29 formed therein, and the slider 19 has a gap 28 formed therein. And, the sensor holes 29 in the lifting block 16 are fitted with photosensors 30. The pusher 27 has a vertical long hole 27a formed therein, with a screw 31 having a diameter smaller than a width of the long hole 27a loosely fitted therein through the isolation wall 22. Therefore, if there is no external force exerting on the pusher 27, the pusher 27 is adapted to stay at the bottom dead point always by its own weight.

The operation of the aforementioned preferred embodiment of the present invention will be explained with reference to FIGS. 7A and 7B.

Referring to FIG. 7A, when the lifting block 16 is at the top dead point, as there is no compressed air in the second cylinders 17, the one pair of sliders 19 are spaced apart by restoring forces of the compressing springs. And, the pusher sensing a modular IC is at the bottom dead point by its own weight. That is, the fingers 9 are spaced apart wider than the width of a modular IC 4 enough to accommodate and grip the modular IC 4 between the fingers 9. Under this condition, the first cylinders(not shown) are operated to lower the lifting block 16 for holding a modular IC 4 in a cassette. In this instance, the fingers 9 are spaced apart enough to hold the modular IC in the cassette.(see FIG. 7A) As the lifting block 16 is lowered, a bottom of the pusher 27 at its bottom dead point is first to come in contact with an upper surface of the modular IC 4, and, as the lifting block 16 is lowered, the pusher 27 is pushed up. Eventually, when the lifting block is fully lowered, the top of the pusher 27 blocks the slits 22b, blocking a light traveling from a light source to a receiver in the photosensor 30. That is, the photosensor 30 informs a controller(not shown) that a modular IC is in a condition of being held. Upon sensing that a modular IC is in a condition of being held by the photosensor 30, the second cylinders 17 are supplied with compressed air. Then, the rod 17a on each of the second cylinders 17 pushes respective sliders 19 so that the sliders 19 move inwardly in opposite directions along the guide bars 20 while compressing the elastic members 21, allowing the fingers 9 to come closer to grip the modular IC at both sides thereof as shown in FIG. 7B. After the lifting block 16 is lowered and the modular IC 4 in the cassette is held, compressed air to the first cylinders is turned off, to lift the lowered lifting block 16 up to the top dead point, thereby completing picking up of the modular IC in the cassette. Thereafter, like the background art, the lifting block 16, holding the modular IC, is moved to a space over a test socket along the robot shaft by the carrier. After the lifting block 16 is moved to a space over a test socket, the first cylinders are operated to lower the lifting block to its bottom dead point as explained before. When compressed air to the second cylinders 17 is stopped the fact that the lifting block 16 is positioned at the bottom dead point is sensed by a separate sensor(not shown), the sliders 19 come closer in opposite directions to restore their initial state by the restoring forces of the elastic members 21, and to load the modular IC held between the fingers 9 in the socket. The aforementioned operation explains a process for loading a modular IC in a cassette on a test socket, and a process for unloading a modular IC of which testing is completed from a test socket to another cassette, i.e., unloading a cassette is also the same.

It is apparent that the operation explained up to now is continuous while the handler is operative, in which operation either a modular IC in a cassette following production is loaded into a socket by a lifting block 16, or a modular IC of which testing is completed and that is loaded in the socket is unloaded to an empty cassette according to a result of the test.

The present invention as has been explained has the following advantages over the background art.

First, the assembly of the finger and the slider 19 at the stepped portion at a lower part of one side of the slider and the jointing portion on the finger for jointing to the stepped portion such that a reference surface on the finger is brought into a close contact with an under side of the slider improves a preciseness of the finger 9 assembly.

Second, the unitary horizontal movement cylinder, the second cylinder 17 with the lifting block, which allows minimizing an assembly tolerance, facilitates a precise control.

Third, the wear at a friction surface in moving back and forth of the slider 19 is minimized by the ball bush 25.

Fourth, the use of only one line of compressed air hose per one second cylinder 17 resulted from the use of single acting type second cylinders allows to minimize a length of the compressed air hose and prevent interference to the lifting block 16 and the second cylinders 17 by the compressed air hose 15 when the fingers 9 are moved.

It will be apparent to those skilled in the art that various modifications and variations can be made in the device for holding a modular IC in a modular IC handler of the present invention without departing from the spirit or scope of the invention. Thus, it is intended that the present invention cover the modifications and variations of this invention provided they come within the scope of the appended claims and their equivalents.

What is claimed is:

1. A device for holding a modular IC in a modular IC handler, comprising:

a lifting block having two ends and a central isolation wall that is capable of moving over a certain stroke in up and down directions;

a guide bar coupled to the lifting block in a horizontal direction;

one pair of horizontal movement cylinders each in one of the ends of the lifting block unitary therewith;

one pair of sliders coupled to the guide bar for horizontal movement in opposite directions to each other according to operation of the cylinders;

one pair of fingers respectively coupled to the one pair of sliders, wherein each of said fingers is held in a fixed relationship to the respective slider; and sensing means coupled to the lifting block for sensing presence of the modular IC.

2. A device as claimed in claim 1, wherein the cylinders are of a single acting type, and elastic members are provided between each of the sliders and the isolation wall.

3. A device as claimed in claim 1, wherein a ball bush is inserted between the slider and the guide bar.

4. A device as claimed in claim 1, wherein a stepped portion is formed at a lower part of one side of the slider and a jointing portion is formed on the finger for jointing to the stepped portion, to bring a reference surface of the finger into a close contact with an under side of the slider.

5. A device for holding a modular IC in a modular IC handler, comprising:

- a lifting block having two ends and a central isolation wall that is capable of moving over a certain stroke in up and down directions;
- a guide bar coupled to the lifting block in a horizontal direction;
- one pair of horizontal movement cylinders each in one of the ends of the lifting block unitary therewith;
- one pair of sliders coupled to the guide bar for horizontal movement in opposite directions to each other according to operation of the cylinders;
- one pair of fingers respectively coupled to the one pair of sliders; and
- sensing means coupled to the lifting block for sensing presence of the modular IC, wherein the sensing means includes,
- a pusher fitted in the isolation wall of the lifting block for moving in up and down directions depending on contact of the pusher with the modular IC, and
- a photosensor at each of the two ends of the lifting block for detecting whether the pusher is in an up position or in a down position.

6. A device as claimed in claim 5, wherein slits, sensor holes and gaps are formed in the isolation wall, the two ends of the lifting block and the sliders respectively for allowing a light from the photosensor to pass, and

- a recess in the isolation wall of the lifting block for fitting the pusher therein.

* * * * *